United States Patent
Kaplan (10) Patent No.: US 7,253,759 B1
(45) Date of Patent: Aug. 7, 2007

(54) CONTINUOUS-TIME DELTA-SIGMA MODULATORS USING DISTRIBUTED RESONATORS

(75) Inventor: Todd Kaplan, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/449,213

(22) Filed: Jun. 7, 2006

Related U.S. Application Data (62) Division of application No. 10/973,741, filed on Oct. 25, 2004.

(51) Int. Cl.
  H03M 3/00 (2006.01)
(52) U.S. Cl. ............ 341/143; 341/133
(58) Field of Classification Search ......... 341/130–170
See application file for complete search history.

(56) References Cited

U.S. PATENT DOCUMENTS

| | | | |
|---|---|---|---|
| 5,039,989 A | | 8/1991 | Welland et al. ............ 341/143 |
| 5,311,181 A | | 5/1994 | Ferguson et al. .......... 341/143 |
| 5,608,400 A | * | 3/1997 | Pellon ....................... 341/143 |
| 5,673,044 A | | 9/1997 | Pellon ....................... 341/143 |
| 5,729,230 A | * | 3/1998 | Jensen et al. ............. 341/143 |
| 6,020,836 A | * | 2/2000 | Tlaskal ...................... 341/143 |
| 6,292,121 B1 | | 9/2001 | Cake et al. ................. 341/143 |
| 6,362,762 B1 | * | 3/2002 | Jensen et al. ............. 341/143 |
| 6,396,428 B1 | | 5/2002 | Cheng ....................... 341/143 |
| 6,437,718 B1 | * | 8/2002 | Oyama et al. ............ 341/143 |
| 6,462,687 B1 | * | 10/2002 | Eshraghi et al. .......... 341/143 |
| 6,608,581 B1 | | 8/2003 | Semenov .................. 341/155 |
| 6,816,103 B2 | * | 11/2004 | Jonsson et al. .......... 341/160 |
| 6,880,262 B1 | | 4/2005 | Jensen ...................... 341/155 |
| 6,897,796 B2 | | 5/2005 | Dias et al. ................. 341/143 |
| 7,057,541 B1 | * | 6/2006 | Kaplan ..................... 341/143 |
| 2004/0239541 A1 | | 12/2004 | Xu ............................ 341/143 |

FOREIGN PATENT DOCUMENTS

EP          1418674 A1  *   5/2004   ................ 341/143

OTHER PUBLICATIONS

Chao, K.C. -H, et al., "A Higher Order Topology for Interpolative Modulators for Oversampling A/D Converters," *IEEE Transactions on Circuits and Systems*, vol. 37, No. 3, pp. 309-318 (Mar. 1990).
Kuhn, W.B., et al., "Dynamic Range of High-Q OTA-C and Enhanced-Q LC RF Bandpass Filters," *Proceedings of the 37th Midwest Symposium on Circuits and Systems*, vol. 2, pp. 767-771 (1995), no month.

(Continued)

*Primary Examiner*—Lam T. Mai
(74) *Attorney, Agent, or Firm*—Ladas & Parry (57) ABSTRACT

A distributed resonator or filter in a continuous-time delta-sigma modulator is disclosed, where the transfer function of the resonator or filter repeats every $F_s$, where $F_s$ is the sampling frequency of the modulator. On one side, like continuous-time delta-sigma modulators, the disclosed modulator does not require a high-precision track-and-hold, and additionally can take advantage of the high Q of distributed resonators. On the other side, like discrete-time delta-sigma modulators, the disclosed modulator is insensitive to feedback loop delays and can subsample.

2 Claims, 4 Drawing Sheets

OTHER PUBLICATIONS

Hernández, L., et al., "A Jitter Insensitive Continuous-Time ΣΔ Modulator Using Transmission Lines," *Proceedings of the 11th International Conference on Electronics, Circuits, and Systems*, pp. 109-112 (2004), no month.

Hernández, L., "Continuous-Time Sigma-Delta Modulators With Reduced Timing Jitter Sensitivity Based on Time Delays," *Electronics Letters*, vol. 39, No. 14, pp. 1039-1041 (Jul. 10, 2003).

Hernández, L., et al., "Sixth-Order Programmable Bandwidth Bandpass Sigma-Delta Modulator Implemented With Transmission Lines," *Electronics Letters*, vol. 40, No. 25, pp. 1575-1576 (Dec. 9, 2004).

Pozar, D., *Microwave Engineering*, Addison-Wessley, Massachusetts, pp. 336-343 (1990), no month.

Pozar, D., *Microwave Engineering*, Second Edition, John Wiley & Sons, Inc., New York, pp. 206-213 (1998).

Raghavan, G., et al., "Architecture Design, and Test of Continuous-Time Tunable Intermediate-Frequency Bandpass Delta-Sigma Modulators," *IEEE Journal of Solid-State Circuits*, vol. 36, No. 1, pp. 5-13 (Jan. 2001).

van Engelen, J., et al., *Bandpass Sigma Delta Modulators: Stability Analysis, Performance and Design Aspects*, Kluwer Academic Publishers, Boston, pp. 107-119 (1999), no month.

* cited by examiner

CONTINUOUS-TIME DELTA-SIGMA MODULATORS USING DISTRIBUTED RESONATORS

CROSS REFERENCE TO RELATED APPLICATIONS

This patent application is a divisional application of U.S. application Ser. No. 10/973,741, filed on Oct. 25, 2004, the disclosure of which is incorporated herein by reference.

TECHNICAL FIELD

The present disclosure relates to delta-sigma ($\Delta\Sigma$) modulators, in particular continuous-time $\Delta\Sigma$ modulators using distributed resonators.

BACKGROUND INFORMATION

Delta sigma ($\Delta\Sigma$) modulators are known in the prior art and may be used in connection with analog-to-digital (A/D) conversion of data (signals) for high-IF subsampling. Typical high frequency A/D converters have high frequency sample and hold circuits. Unfortunately, as the A/D conversion frequency increases, the sample and hold circuits become more and more imprecise. Continuous-time $\Delta\Sigma$ A/D converters do not need sample and hold circuits at the input. But while continuous-time $\Delta\Sigma$ A/D converters offer high-IF resolution, they have a low precision sampler (which can be as imprecise as 1 bit).

A large amount of literature has been devoted to continuous-time $\Delta\Sigma$ modulators (CT-$\Delta\Sigma$M's) that use OTA-C (operational transconductance amplifier capacitor) or LC (inductor capacitor) resonators. See, for example, (1) G. Raghavan, et al., "Architecture, design, and test of continuous-time tunable intermediate-frequency bandpass delta-sigma modulators," *IEEE Journal of Solid-State Circuits*, vol. 36, no. 1, January 2001, pp. 5–13 and (2) J. van Engelen et al., *Bandpass Sigma Delta Modulators: Stability Analysis, Performance and Design Aspects*, Kluwer Academic Publishers, 1999. The dynamic range of a CT-$\Delta\Sigma$M can improve by a factor of $Q_0^2$ over the dynamic range of an OTA-C resonator, where $Q_0$ is the unloaded Q of the resonator. See W. B. Kuhn, F. W. Stephenson and A. Elshabini-Riad, "Dynamic Range of high-Q OTA-C and enhanced-Q LC RF bandpass filters," *Proceedings of the 37th Midwest Symposium on Circuits and Systems*, 1994, vol. 2, pp. 767–771. While LC resonators typically have $Q_0$'s around 10, distributed resonators can have $Q_0$'s in the hundreds.

To realize a system with a distributed resonator, one would, for example, input current into the resonator and measure its voltage. For the rest of this paper, we will assume that we are using a transmission-line resonator where one forces a current into the resonator and measures the voltage, but the proposed method will also work for arbitrary distributed resonators, and additionally the proposed method will work for designs where one forces a voltage across the resonator and measures the current. The impedance of a transmission-line resonator would then form the transfer function.

Figure 1:
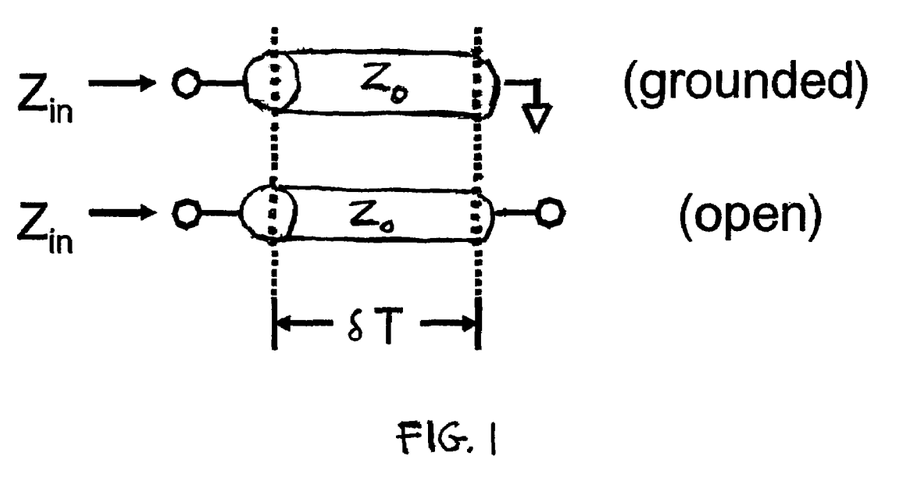
FIG. 1 depicts a grounded and open transmission-line resonator.

FIG. 1 depicts a grounded transmission-line resonator and an open transmission-line resonator. Examining FIG. 1, let $\delta T$ be the propagation delay through the resonator and T be the sampling time. Once the substitution $\beta l = \omega \delta T$ is made, then the impedance is given as (see D. Pozar, *Microwave Engineering*, Addison-Wessley, Massachusetts, 1990, pp. 336–343):

$$Z_{in}(s) = \begin{cases} jZ_0 \tan(\omega \delta T) = Z_0 \dfrac{1 - e^{-2s\delta T}}{1 + e^{-2s\delta T}} \text{ (grounded)} \\ jZ_0 \cot(\omega \delta T) = Z_0 \dfrac{1 + e^{-2s\delta T}}{1 - e^{-2s\delta T}} \text{ (open)} \end{cases} \quad (1)$$

Reference will be made to the case of the grounded resonator, although the following analysis can easily be generalized to the open resonator. If the resonator's fundamental resonance frequency is $f_0$, then there are additional resonances at $3f_0$, $5f_0$, $7f_0$ and so on. $\Delta\Sigma$ modulators comprise a feedback DAC. If the feedback DAC generates output components at these frequencies, the harmonics will resonate and influence the signal into the quantizer. At best, these harmonics create significant aliases. Let $F_S$=the sampling frequency and let $f_n$=the harmonic frequency. We let $k_n = \mathrm{mod}(f_n, F_S)$. Then, the alias frequencies after sampling are given as:

$$a_n = \begin{cases} k_n, & k_n < F_S/2 \\ F_S/2 - k_n, & k_n \geq F_S/2 \end{cases} \quad (2)$$

These aliases can severely degrade the SNR or cause the modulator to go unstable.

A possible method to overcome this problem is that of decreasing the high-frequency DAC components by slowing the DAC down. However, in this way the likelihood of intersymbol interference is increased, because the DAC may not fully settle by the time it needs to switch again.

The present disclosure offers an alternative method to overcome the above shortcomings.

BRIEF DESCRIPTION OF THE DISCLOSED TECHNOLOGY

According to a first aspect, a continuous-time delta-sigma modulator with a sampling frequency $F_s$ is disclosed, the modulator comprising a component chosen between a distributed filter and a distributed resonator, the component having a plurality of resonant frequencies comprising a fundamental resonant frequency $f_0 = F_s/4$.

According to a second aspect, a component chosen between a distributed filter and a distributed resonator in a continuous-time delta-sigma modulator having a sampling frequency $F_s$ is disclosed, the component having a component transfer function repeating every $F_s$.

According to a third aspect, a continuous-time delta-sigma modulator having a sampling frequency $1/T$ and comprising a distributed filter having a propagation time $\delta T$ is disclosed, wherein $\delta$ is so selected to satisfy the expression $2\delta = m$, m being a positive integer.

According to a fourth aspect, a continuous-time delta-sigma modulator having a sampling frequency $1/T$ and comprising a distributed resonator having a propagation time $\delta T$ is disclosed, wherein $\delta$ is so selected to satisfy the expression $2\delta = m$, m being a positive integer.

According to a fifth aspect, a continuous-time delta-sigma modulator is disclosed, comprising: a first feedforward transconductor; at least one distributed filter connected with the first feedforward transconductor, the at least one distributed filter having a distributed filter output; a first feedback transconductor connected with the first feedforward transconductor and the distributed filter; a quantizer, located downstream of the first feedforward transconductor and the at least one distributed filter, the quantizer having a quantizer output; and an adder, adding a signal proportional to the quantizer output to a further signal, wherein the delta-sigma modulator has a sampling frequency 1/T, the distributed filter has a propagation time δT, and delta is so selected to satisfy the expression 2δ=m being a positive integer.

According to a sixth aspect, a continuous-time delta-sigma modulator having a sampling frequency $F_s$ is disclosed, comprising: a continuous time filter having a transfer function $H_1(f)$; a quantizer connected with the continuous time filter; and a feedback filter having a transfer function $H_2(f)$, wherein $H_1(f)=H_1(f+nF_s)$ and $H_2(f)$ $H_2(f+nF_s)$, n being an integer.

According to a seventh aspect, a continuous-time delta-sigma modulator is disclosed, the modulator comprising a distributed component chosen between a distributed filter and a distributed resonator.

According to an eighth aspect, a method for allowing subsampling in a continuous-time delta-sigma modulator having a sampling frequency $F_s$ is disclosed, comprising: providing a continuous time filter having a transfer function $H_1(f)$; providing a quantizer; connecting the quantizer with the continuous time filter; providing a feedback filter having a transfer function $H_2(f)$; and selecting $H_1(f)$ and $H_2(f)$ so that $H_1(f)=H_1(f+nF_s)$ and $H_2(f)=H_2(f+nF_s)$, n being an integer.

The ΔΣ modulators according to the present disclosure have several advantages over existing ΔΣ modulator architectures. Like continuous-time ΔΣ modulators, the disclosed ΔΣ modulators do not require a high-precision track-and-hold, and additionally can take advantage of the high Q of distributed resonators. Like discrete-time ΔΣ modulators, the proposed ΔΣ modulators are insensitive to feedback loop delays and can subsample. Simulations of several types of these ΔΣ modulators and examine the challenges in their design.

DESCRIPTION OF THE FIGURES

The present invention will be understood and appreciated more fully from the following detailed description taken in conjunction with the drawings in which.

DETAILED DESCRIPTION

Figure 2:
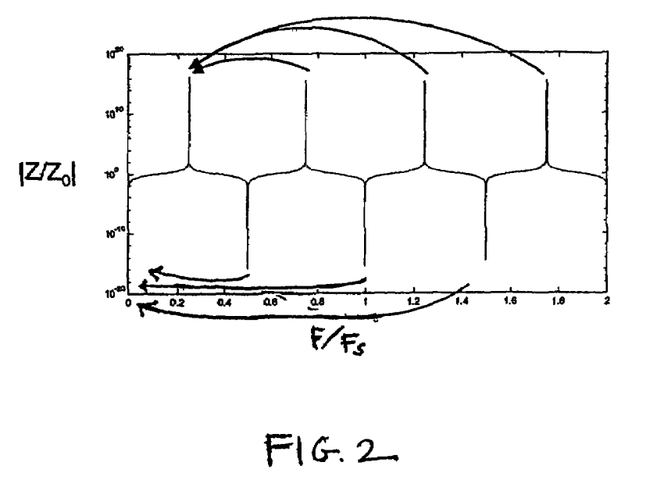
FIG. 2 depicts resonant frequencies of shorted T-line resonator, showing aliases down to the fundamental frequency after sampling.

A specific example of the disclosed concept will be presented before generalizing the disclosed concept. Restricting ourselves to a grounded resonator, for the moment, one can specify that $f_0=F_S/4$, where $f_0$ is the resonator's fundamental resonance frequency and $F_S$ is the clock or sampling frequency. The resonant frequencies of the resonator are then given by $\{F_S/4, 3F_S/4, 5F_S/4 \ldots\}$. When sampled by a clock at $F_S$, all harmonic frequencies alias down to $F_S/4$. This is shown in FIG. 2, which depicts how all higher resonant frequencies alias down to the fundamental resonance frequency $F/F_s=0.25$.

The disclosed concept can be generalized by letting 2δ=m, where m is a positive integer. Then, letting $z=e^{sT}$, equation (1) can be expressed as:

$$Z_{T-line}(z) = \begin{cases} Z_0 \dfrac{1-z^{-m}}{1+z^{-m}} \text{(grounded)} \\ Z_0 \dfrac{1+z^{-m}}{1-z^{-m}} \text{(open)} \end{cases} \quad (3)$$

Thus, although the transmission-line resonator operates in continuous-time, the restriction 2δ=m causes the resonator to act much like a discrete-time resonator after sampling. If this resonator forms the only component in a ΔΣ modulator that would normally need to be represented in continuous-time, the entire ΔΣ modulator has discrete-time properties. These properties include relative immunity to clock delays and the ability to subsample. At the same time, there is no designated track-and-hold at the input, which means that the disclosed modulator keeps the speed and power advantages of continuous-time ΔΣ modulators. In the following discussion, the impulse-invariant transform is used to derive the NTF and STF of a stable $2^{nd}$-order T-line-based ΔΣ modulator. Later on a design methodology for the architecture presented below is disclosed and behavioral-level simulations are discussed. The limitations of such a T-line ΔΣ modulator design will be discussed briefly.

The above-discussed concepts will now be generalized and values for both the coefficients and resonator parameters that yield workable noise transfer functions (NTF) and signal transfer functions (STF) will be derived. This is done in a general manner allowing ΔΣ modulators to be designed with either open or shorted resonators.

Reference will be made to the ΔΣ modulator depicted by FIG. 3. To do this, the impulse-invariant transform is used, which is given as:

$$Z^{-1}[H(z)] = L^{-1}[H(s)]|_{t=nT} \quad (4)$$

Figure 3:
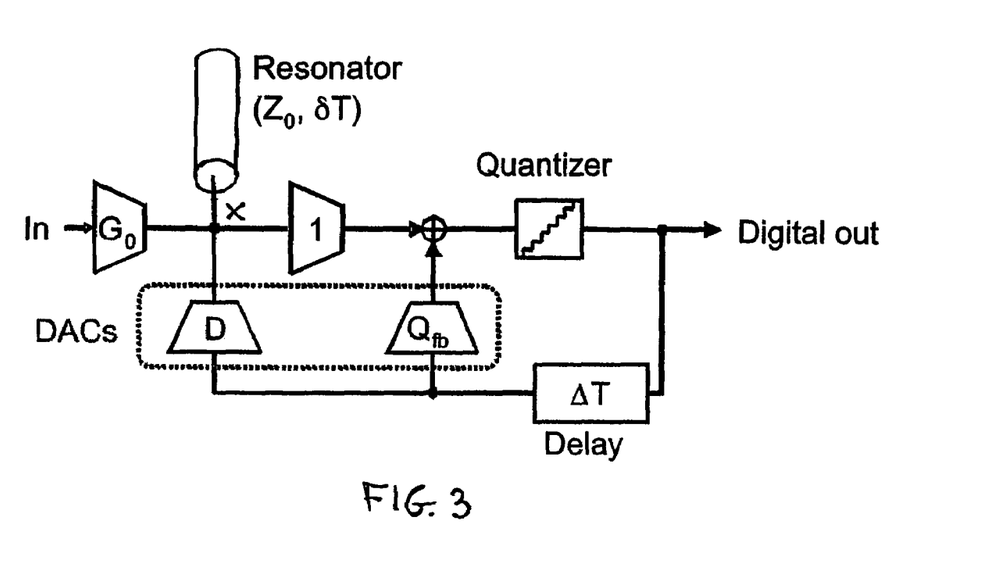
FIG. 3 is a schematic diagram of a ΔΣ modulator using transmission-line resonator.

Solving for $H_D(s)$=the open loop gain through DAC D of FIG. 3, the following equation is obtained:

$$H_D(s) = DZ_0 \frac{1 \mp e^{-2s\delta T}}{1 \pm e^{-2s\delta T}} e^{-s\Delta T} \frac{1-e^{-sT}}{sT} \quad (5)$$

where T is the sampling time and ΔT is the delay through the feedback loop. The top sign in ± refers to the case of a grounded resonator, where the bottom sign refers to the case of an open resonator. Equation (5) can be rewritten as:

$$H_D(s)(1 \pm e^{-2s\delta T}) = DZ_0 \frac{e^{-s\Delta T}}{sT}(1 - e^{-sT} \mp e^{-2sT} \pm e^{-s(T+2\delta T)}). \quad (6)$$

Taking the inverse Laplace transform:

$$h_D(t) \pm h_D(t - 2\delta T) = \frac{DZ_0}{T}[u(t - \Delta T) - u(t - T - \Delta T) \mp u(t - 2\delta T - \Delta T) \pm u(t - T - 2\delta T - \Delta T)], \quad (7)$$

one can solve for t=nT, where n is an integer, normalize for T=1, and then take the Z-transform. While the right-hand side has a Z-transform, the left-hand side does not, unless it is specified that $$m = 2\delta \quad (8)$$

This relationship relates the sampling time to the resonator delay time (or, conversely, the electrical length of the resonator). Using the relationship in equation (8):

$$h_D(n) \pm h_D(n-m) = DZ_0[u(n-\Delta) - u(n-1-\Delta) \mp u(n-m-\Delta) \pm u(n-1-m-\Delta)], \quad (9)$$

a clean and usable NTF can be generated when $m-1 < \Delta < m$. In this case, the Z-transform results in:

$$H_D(z)(1 - z^{-m}) = DZ_0 z^{-m} \frac{1 - z^{-1} \mp z^{-(m-1)} \pm z^{-m}}{1 - z^{-1}} \quad (10)$$

which can be simplified to:

$$H_D(z) = DZ_0 z^{-m} \frac{1 \mp z^{-m}}{1 \pm z^{-m}}. \quad (11)$$

The loop path through $Q_{fb}$ is far simpler to analyze, because it is not frequency-dependent. There is a delay of $\Delta$ through the feedback loop, after which the signal through $Q_{fb}$ is sampled at time nT. The value of $Q_{fb}$ the quantizer samples is simply a T*ceil($\Delta$)-delayed version of the quantizer output. Hence, $$H_{Q_{fb}}(z) = Q_{fb} z^{-\text{ceil}(\Delta)} = Q_{fb} z^{-m}. \quad (12)$$

The results found in equations (11) and (12) are now used to calculate the total open-loop gain H(z):

$$H(z) = \quad (13)$$
$$H_D(z) + H_{Q_{fb}}(z)(1 - z^{-m}) = z^{-m} \frac{DZ_0 \mp DZ_0 z^{-m} + Q_{fb} \pm Q_{fb} z^{-m}}{1 \pm z^{-m}},$$

if $$Q_{fb} = DZ_0 \quad (14)$$

then H(z) simplifies to:

$$H(z) = \frac{2DZ_0 z^{-m}}{1 \pm z^{-m}}. \quad (15)$$

And one can directly solve for the NTF as:

$$NTF(z) = \frac{1}{1 + H(z)} = \frac{1 \pm z^{-m}}{1 \pm (1 \pm 2DZ_0)z^{-m}}. \quad (16)$$

The NTF zeros are given as:

$$NTF_{zeros} = \begin{cases} e^{j\pi\left(\frac{2n+1}{m}\right)} & \text{(grounded)} \\ e^{j\pi\left(\frac{2n}{m}\right)} & \text{(open)} \end{cases} \quad (17)$$

where n=0, 1, ... m−1. The poles of the NTF are given as:

$$NTF_{poles} = \begin{cases} re^{j\pi\left(\frac{2n+1}{m}\right)} & \text{(grounded)} \\ re^{j\pi\left(\frac{2n}{m}\right)} & \text{(open)} \end{cases} \quad (18)$$

where $$r = \sqrt[m]{\frac{1}{1 \pm 2DZ_0}}. \quad (19)$$

It can be seen that the zeros of the NTF are evenly spaced around the unit circle. The poles of the NTF have the same angle as the zeros, but are moved inside or outside depending on the value of r. Assuming that the NTF is desired to be stable, it can be specified that r<1. This means that, for a grounded resonator, D is positive. For an open resonator, D is negative. Further restrictions can be created by invoking Lee's rule (see K. C.-H. Chao, S. Nadeem, W. L. Lee and C. G. Sodini, "A higher order topology for interpolative modulators for oversampling A/D converters," *IEEE Transactions on Circuits and Systems*, vol. 37, no. 3, March 1990, pp. 309–318). We can solve for the maximum value of the NTF, $NTF_{max}$, from equation (15) when $z^{-m} = \pm 1$. This gives:

$$NTF_{max} = \frac{1}{1 \pm DZ_0}. \quad (20)$$

Since D>0 for a grounded resonator and D<0 for an open resonator, we can rewrite equation (19) as:

$$NTF_{max} = \frac{1}{1 + |DZ_0|}. \quad (21)$$

Finally, solving for the STF, from equation (14); if one designs or specifies $DZ_0 = Q_{fb}$, then, at the resonant frequency, the impedance is infinite and the contribution of $Q_{fb}$ is negligible compared to D. At this frequency, this feedback loop closely resembles a buffer with a gain of 1/D. This means the STF=1 at the resonant frequency if the condition $$G_0 = D \quad (22)$$

is met.

Two important points follow from equation (16). First, NTF(z) does not have a δ term. This means that the NTF is identical for any value of δ such that m−1<δ<m, which is the condition used to derive the NTF. This makes this architecture very immune to feedback loop delays. Second, H(f)=H(f+nF$_S$). This means an incoming signal at frequency f is processed exactly the same as an incoming signal at frequency f+nF$_S$. In other words, this modulator can subsample. These properties are in stark contrast to an OTA-C or LC-based ΔΣ modulator, where the NTF is very sensitive to delays and the resonators are designed to resonate at only one frequency. At the same time, this modulator operates in continuous-time, which means it does not need a sampler at its input. It is believed that the system according to the present disclosure is the only system that can downconvert and digitize without a mixer or high-resolution sampler.

After deriving these formulas, the ΔΣ modulators in accordance with this disclosure can be designed. First, choose the desired NTF zeros as given by equation (16). The following Table I lists resonant frequencies for open and shorted resonators with different values of m. Additionally, Table II lists NTF zeros for open and shorted resonators with different values of m.

TABLE I

| m | Grounded | Open |
|---|---|---|
| 1 | $F_S/2, 3F_S/2, 5F_S/2$ ... | $0, F_S, 2F_S, 3F_S$ ... |
| 2 | $F_S/4, 3F_S/4, 5F_S/4$ ... | $0, F_S/2, F_S, 3F_S/2$ ... |
| 3 | $F_S/6, F_S/2, 5F_S/6$ ... | $0, F_S/3, 2F_S/3, F_S$ ... |
| 4 | $F_S/8, 3F_S/8, 5F_S/8$ ... | $0, F_S/4, F_S/2, 3F_S/4$ ... |

TABLE II

| m | Grounded | Open |
|---|---|---|
| 1 | $F_S/2$ | 0 |
| 2 | $F_S/4$ | $0, F_S/2$ |
| 3 | $F_S/6, F_S/2$ | $0, F_S/3$ |
| 4 | $F_S/8, 3F_S/8$ | $0, F_S/4, F_S/2$ |

Note that, for m=1, grounded resonators have purely bandpass ΔΣ output waveforms, while open resonators generate lowpass Δ: output waveforms. All other values of m produce multiple NTF notches.

After selecting the desired notch positions from Table I and Table II, the value of D is chosen from NTF$_{max}$. Using equation (22), find |D|:

$$|D| = \frac{1}{Z_0} \frac{NTF_{max} - 1}{NTF_{max}} \quad (23)$$

As mentioned above, a negative value is chosen for D if the resonator has a shorted end, and a positive value for D if the resonator has an open end. Using equations (14) and (22), $Q_{fb}=DZ_0$, and $G_0=D$. The resultant system is then shown in FIG. 4.

Figure 4:
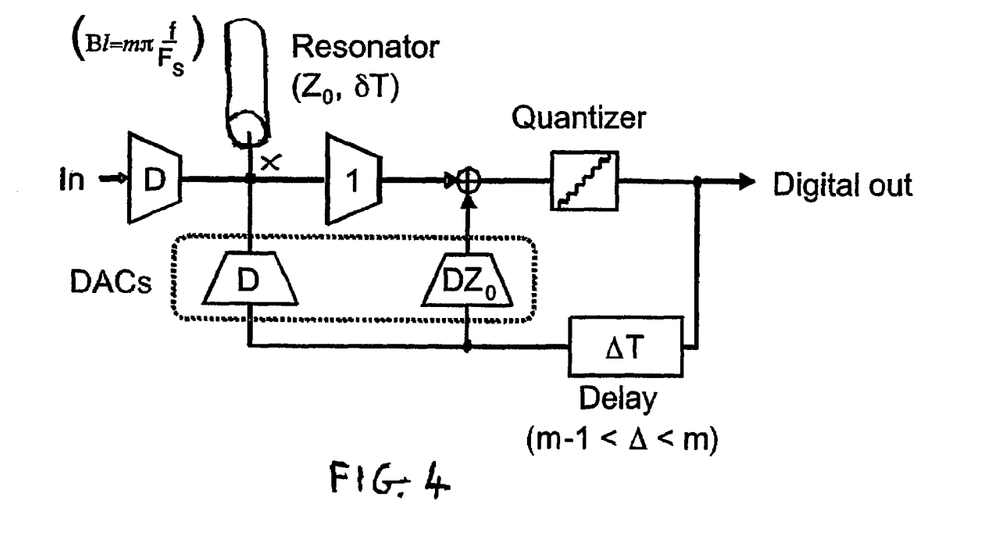
FIG. 4 is a specific embodiment of the modulator of FIG. 3.

The delta-sigma modulators shown in FIGS. 3 and 4 are shown for exemplary purposes only. Any embodiment where the filter is a distributed filter, such as a distributed resonator, can be employed. For example, embodiments with only one feedback transconductor, or more than two feedback transconductors can be employed. Additionally, also embodiments with multiple filters or resonators, where at least one of the filters or resonators is a distributed filter or resonator can be thought of.

Figure 5:
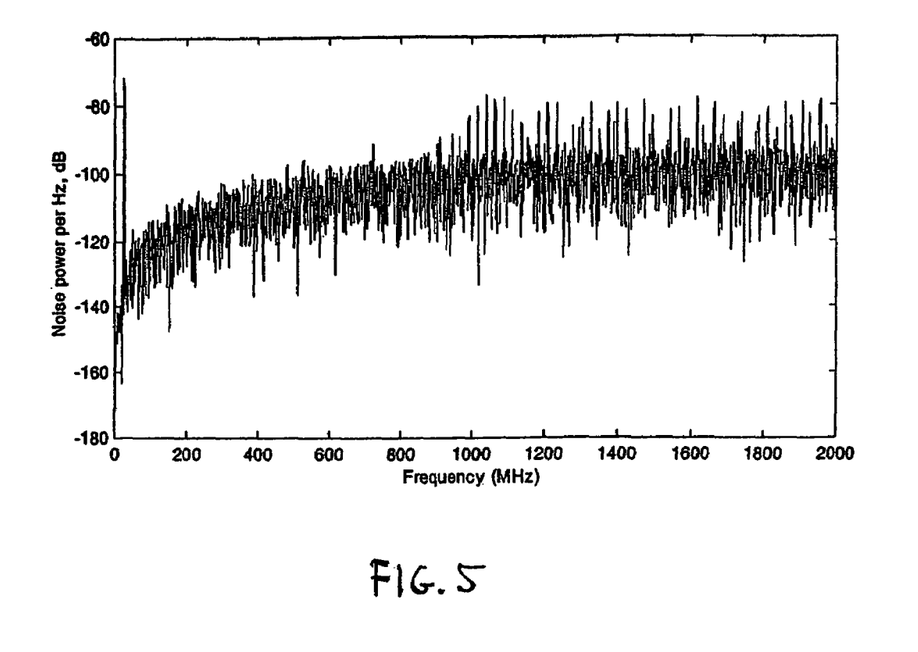
FIG. 5 is a graph showing the simulated results of the design of a 1-bit, low-pass continuous-time ΔΣ modulator with $F_s$=4 GHz and m=1 for a 24 MHz input.

Some examples using the methodology according to the present disclosure were designed and simulated using Simulink® software. First, a 1-bit, lowpass ΔΣ modulator with $F_S$=4 GHz was designed in accordance with the foregoing disclosure. From Table I, m=1 and an open-ended resonator are needed. Choosing NTF$_{max}$=1.6, DZ$_0$=0.375 is derived. If $Z_0$=50 ohms, then D=7.5×10$^{-3}$. Because m=1, D must be between 0 and 1. For this simulation, assume D=0.1 and introduce a dither source at the quantizer input with a standard deviation of 0.1. The results of this simulation are shown in FIG. 5. With a 24 MHz input sine wave with an amplitude of 0.5, the SNR is 64 dB in 10 MHz and about 78 dB in MHz.

From the analysis above, one should expect this modulator to have subsampling capability. This capability is backed by simulations. If the input's signal frequency is 8.024 GHz, the FFT and SNR are virtually indistinguishable from the FFT and SNR from a baseband input.

Without any pole in the feedback loop, the modulator shows identical results regardless of the value of D, so long as it was in the range of 0<D<1. However, if a pole is introduced in the DAC, it can degrade the SNR by increasing the delay. For example, if the pole is at 2F$_S$, the SNR degrades by about 6 dB if the delay is increased from 0.1 T to 0.9 T.

Figure 6:
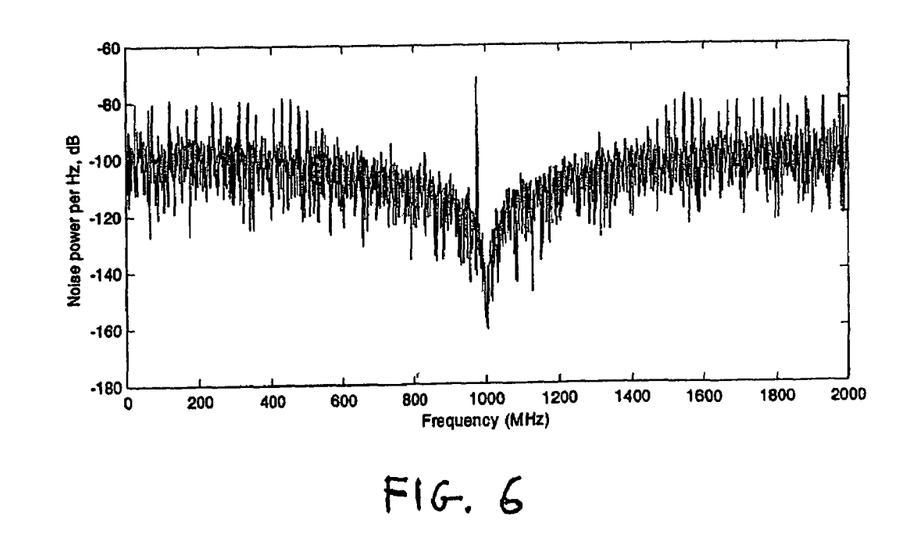
FIG. 6 is a graph showing the simulated FFT outputs for a design of a bandpass continuous-time ΔΣ modulator with m=2 and $F_s$=4 GHz for 976 MHz and 8.976 GHz inputs, respectively.

While the previous example can be very useful, a lowpass ΔΣ modulator can suffer from a numbers of drawbacks when subsampling. First, after digitization, an input signal at $F_S$+Δf is indistinguishable form an input signal at $F_S$−Δf. This creates a severe restriction on the anti-alias filter if one wishes to subsample. Second, lowpass modulators are susceptible to 1/f noise, DC offsets and clock feedthrough. For these reasons, we may get a higher-resolution output of a high-frequency signal using a bandpass ΔΣ modulator. In the second example, choose m=2 with a shorted resonator. Choosing NTF$_{max}$=1.6, DZ$_0$=−0.375. The feedback delay must then be between 1 and 2 clock cycles. This delay can be very useful. It allows the addition of latches that reduce metastability and also can be used to introduce mismatch-shaping logic. FIG. 6 shows the resultant output FFT of the system for a 976 MHz input and 8.976 GHz, with $F_S$=4 GHz. The SNR is 63 dB in a 10 MHz bandwidth, and 81 dB in a 1 MHz band in both cases.

Figure 7:
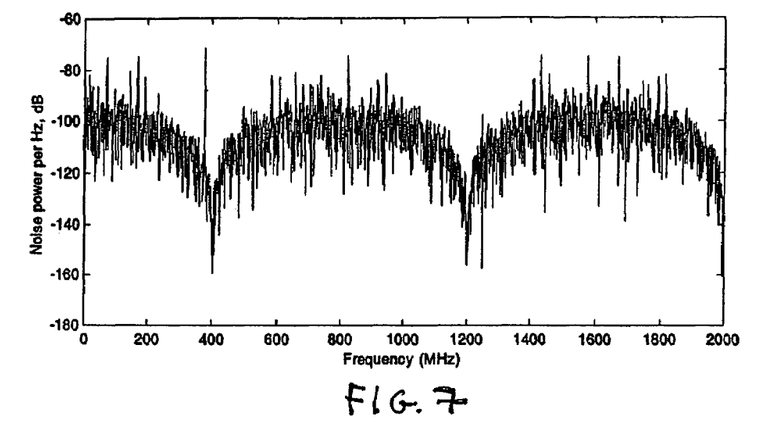
FIG. 7 is a graph showing the simulated FFT output for a design of a continuous-time ΔΣ modulator with m=5 and Fs=4 GHz for a 376 MHz input.

If higher values of m are chosen, more NTF zeros are obtained, as shown in FIG. 7. The output of FIG. 7 was obtained with a shorted resonator with m=5. The SNR is 57 dB in a 10 MHz bandwidth, and increases to 72 dB in a 1 MHz bandwidth. The SNR degraded because, from equations (19) and (23), the NTF poles have moved closer to the NTF zeros in order to fulfill Lee's Rule.

In the following, circuit limitations will be briefly examined, to analyze their influence on the design and performance of the modulator.

A. Internal Voltage Swings

The feedback loop is essentially designed so the DAC cancels the input at point x. However, the input is designed to be narrowband, while the DAC output has a wide bandwidth. While the DAC can cancel the input at one frequency, it does not at the harmonics of the DAC signal. These harmonics can feed into the resonator harmonics and create very large voltage swings.

There are several measures one can take to help prevent this. First, the Q of the resonator can be deliberately lowered. While this reduces the noise shaping, it also prevents high resonance values. In the previous example, a 1-Ω resonator can be used to significantly dampen the resonator voltages without unduly sacrificing SNR. Secondly, the DAC into the resonator can be slowed down so it has fewer high-frequency components. Finally, a voltage clamp can be placed on node x.

B. Parasitics

The second problem deals with parasitics at node x. There is parasitic inductance to the resonator, and parasitic capacitance in parallel with the resonator. These alter the frequency-dependent impedance of the transmission line, and affect the resonant frequencies given in Tables I and II.

Figure 8:
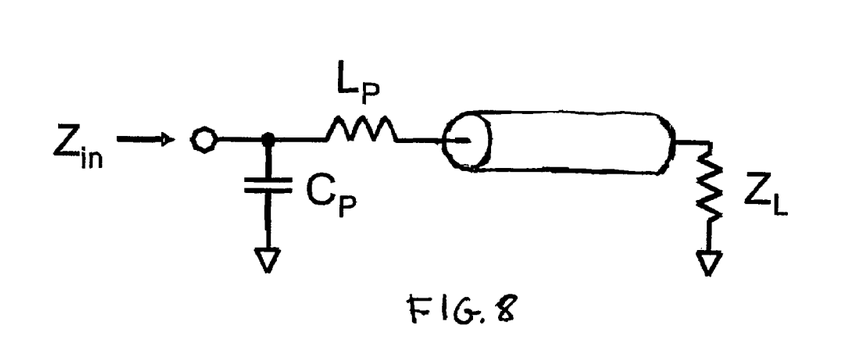
FIG. 8 is a model of a grounded resonator.

Consider a parasitic model of a grounded resonator in FIG. 8. The parasitic capacitance $C_P$ is caused by the devices and pads. $L_P$ is the parasitic inductance to the resonator, and $Z_L$ represents the load resistance. We can solve for the input impedance $Z_{in}$ using ABCD matrices (see Pozar, infra, at pp. 231–233).

Figure 9:
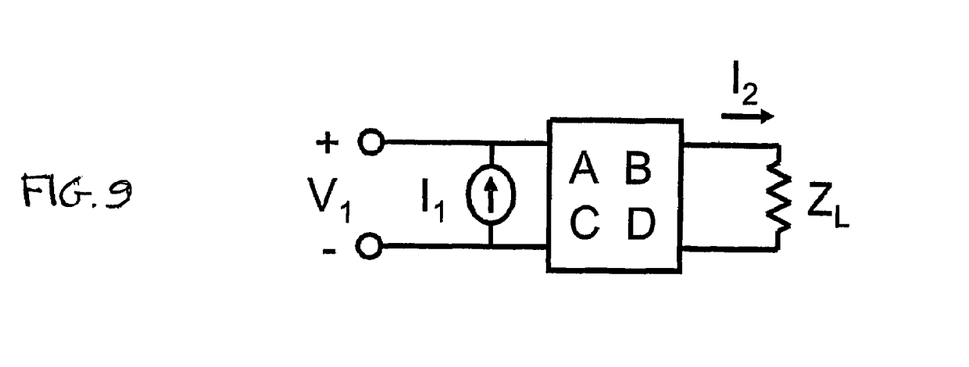
FIG. 9 is a diagram of a general ABCD matrix with a terminated load.

First, examine a general ABCD matrix with a terminated load as shown in FIG. 9. This matrix can be solved as:

$$\begin{bmatrix} V_1 \\ I_1 \end{bmatrix} = \begin{bmatrix} A & B \\ C & D \end{bmatrix} \begin{bmatrix} Z_L \\ 1 \end{bmatrix} I_2 = \begin{bmatrix} AZ_L + B \\ CZ_L + D \end{bmatrix} I_2. \quad (24)$$

Thus, $$Z_{in} = \frac{V_1}{I} = \frac{AZ_L + B}{CZ_L + D}. \quad (25)$$

For the resonator in FIG. 8, the ABCD matrix is $$\begin{bmatrix} A & B \\ C & D \end{bmatrix} = \begin{bmatrix} 1 & sL_P \\ sC_P & 1+s^2L_PC_P \end{bmatrix} \begin{bmatrix} \cos\omega\Delta T & jZ_0\sin\omega\Delta T \\ j/Z_0\sin\omega\Delta T & \cos\omega\Delta T \end{bmatrix}. \quad (26)$$

Then, from equations (25) and (26), $$Z_{in} = \frac{sL + Z_L + jZ_0\tan\omega\Delta T\left(1 + sL_P\frac{Z_L}{Z_0^2}\right)}{1 + sC_PZ_L + s^2L_PC_P + jZ_0\tan\omega\Delta T\left(sC_P + (1 + s^2L_PC_P)\frac{Z_L}{Z_0^2}\right)}. \quad (27)$$

To gain a more intuitive understanding of equation (27), let $Z_L=0$, in which case equation (27) reduces to:

$$Z_{in} = \frac{sL_P + jZ_0\tan\omega\Delta T}{1 - \omega^2L_PC_P - \omega C_PZ_0\tan\omega\Delta T}. \quad (28)$$

The poles of $Z_{in}$ are a function of $L_P$ and $C_P$, and have terms in $\omega^2$ and $\omega$, as well as $\tan\omega\Delta T$. This means that the poles no longer nicely repeat. The fundamental resonant frequency can be controlled in the presence of $L_P$ and $C_P$ by adjusting $\Delta T$. However, the harmonics do not necessarily alias back to the fundamental frequency. This makes subsampling dependent on very careful configuration that minimizes parasitics.

In conclusion, a simple continuous-time $\Delta\Sigma$ modulator with distributed resonators, such as transmission-line resonators, can be designed with the proviso that the harmonics fold back into the fundamental resonant frequencies after sampling. Furthermore, these modulators have two useful properties: First, they are relatively insensitive to feedback loop delays. Second, they do not differentiate signals at $f=f_0$ from $f=f_0+nF_S$, where n is an integer. This allows for efficient subsampling of narrowband signals at very high frequencies with simple circuitry that does not require either a mixer or high-precision sampler.

It will be appreciated that the present disclosure is not limited to what has been particularly shown and described herein above. Rather the scope of the present disclosure is defined by the claims which follow.

What is claimed is:

1. A continuous-time delta-sigma modulator having a sampling frequency 1/T and comprising a distributed filter having a propagation time δT, wherein δ is so selected to satisfy the expression 2δ=m, m being a positive integer.

2. A continuous-time delta-sigma modulator having a sampling frequency 1/T and comprising a distributed resonator having a propagation time δT, wherein δ is so selected to satisfy the expression 2δ=m, m being a positive integer.

* * * * *